United States Patent
Huemoeller et al.

(10) Patent No.: US 7,501,338 B1
(45) Date of Patent: Mar. 10, 2009

(54) SEMICONDUCTOR PACKAGE SUBSTRATE FABRICATION METHOD

(75) Inventors: Ronald Patrick Huemoeller, Chandler, AZ (US); David Jon Hiner, Chandler, AZ (US); Sukianto Rusli, Phoenix, AZ (US); Richard Sheridan, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 127 days.

(21) Appl. No.: 11/527,104

(22) Filed: Sep. 25, 2006

Related U.S. Application Data

(60) Division of application No. 10/701,782, filed on Nov. 5, 2003, now abandoned, which is a continuation-in-part of application No. 10/261,868, filed on Oct. 1, 2002, now abandoned, and a continuation-in-part of application No. 10/138,225, filed on May 1, 2002, now Pat. No. 6,930,256, and a continuation-in-part of application No. 09/931,144, filed on Aug. 16, 2001, now Pat. No. 6,784,376, and a continuation-in-part of application No. 09/884,193, filed on Jun. 19, 2001, now Pat. No. 6,967,124.

(51) Int. Cl.
*H01L 21/4763* (2006.01)

(52) U.S. Cl. ............... 438/622; 438/667; 257/E21.508; 174/261

(58) Field of Classification Search ........... 438/622, 438/629, 667; 174/261; 257/E21.508, E23.021
See application file for complete search history.

(56) References Cited

U.S. PATENT DOCUMENTS 3,833,838 A 9/1974 Christiansen ............... 361/777

(Continued)

FOREIGN PATENT DOCUMENTS

JP 05-109975 4/1993

(Continued)

OTHER PUBLICATIONS

Huemoeller et al., U.S. Appl. No. 10/701,782, filed Nov. 5, 2003, entitled "Integrated Circuit Substrate Having Embedded Lands With Etching And Plating Control Shapes".

(Continued)

*Primary Examiner*—Fernando L Toledo
(74) *Attorney, Agent, or Firm*—Gunnison, McKay & Hodgson, L.L.P.; Serge J. Hodgson

(57) ABSTRACT

An integrated circuit substrate having embedded lands with etching and plating control features provides improved manufacture of a high-density and low cost mounting and interconnect structure for integrated circuits. The integrated circuit substrate is formed by generating channels in a dielectric material, adding conductive material to fill the channels and then planarizing the conductive material, so that conductors are formed beneath the surface of the dielectric material. Lands are formed with feature shapes that reduce a dimpling effect at etching and/or an over-deposit of material during plating, both due to increased current density at the relatively larger land areas. Feature shapes may be a grid formed with line sizes similar to those employed to form conductive interconnects, so that all features on the substrate have essentially the same line width. Alternatively, and in particular for circular pads such as solderball attach lands, sub-features may be radially disposed around a central circular area and connected with channels formed as interconnect lines that connect the sub-features to the central circular area. Connection of the lands may be made using vias or by other conductive channels forming electrical interconnect lines.

20 Claims, 5 Drawing Sheets

U.S. PATENT DOCUMENTS

| | | | |
|---|---|---|---|
| 3,868,724 A | 2/1975 | Perrino | 357/65 |
| 3,916,434 A | 10/1975 | Garboushian | 357/74 |
| 4,322,778 A | 3/1982 | Barbour et al. | 361/414 |
| 4,532,419 A | 7/1985 | Takeda | 235/492 |
| 4,642,160 A | 2/1987 | Burgess | 156/630 |
| 4,685,033 A | 8/1987 | Inoue | 361/414 |
| 4,706,167 A | 11/1987 | Sullivan | 361/406 |
| 4,716,049 A | 12/1987 | Patraw | 427/96 |
| 4,786,952 A | 11/1988 | MacIver et al. | 357/23.4 |
| 4,811,082 A | 3/1989 | Jacobs et al. | 357/80 |
| 4,897,338 A | 1/1990 | Spicciati et al. | 430/314 |
| 4,905,124 A | 2/1990 | Banjo et al. | 361/395 |
| 4,964,212 A | 10/1990 | Deroux-Dauphin et al. | 29/852 |
| 4,974,120 A | 11/1990 | Kodai et al. | 361/392 |
| 4,996,391 A | 2/1991 | Schmidt | 174/255 |
| 5,021,047 A | 6/1991 | Movern | 604/110 |
| 5,072,075 A | 12/1991 | Lee et al. | 174/264 |
| 5,081,520 A | 1/1992 | Yoshii et al. | 357/80 |
| 5,108,553 A | 4/1992 | Foster et al. | 205/125 |
| 5,110,664 A | 5/1992 | Nakanishi et al. | 428/195 |
| 5,191,174 A | 3/1993 | Chang et al. | 174/266 |
| 5,229,550 A | 7/1993 | Bindra et al. | 174/262 |
| 5,239,448 A | 8/1993 | Perkins et al. | 361/764 |
| 5,247,429 A | 9/1993 | Iwase et al. | 362/29 |
| 5,283,459 A | 2/1994 | Hirano et al. | 257/419 |
| 5,371,654 A | 12/1994 | Beaman et al. | 361/744 |
| 5,379,191 A | 1/1995 | Carey et al. | 361/777 |
| 5,404,044 A | 4/1995 | Booth et al. | 257/698 |
| 5,463,253 A | 10/1995 | Waki et al. | 257/724 |
| 5,474,957 A | 12/1995 | Urushima | 437/209 |
| 5,474,958 A | 12/1995 | Djennas et al. | 437/211 |
| 5,508,938 A | 4/1996 | Wheeler | 364/488 |
| 5,530,288 A | 6/1996 | Stone | 257/700 |
| 5,531,020 A | 7/1996 | Durand et al. | 29/840 |
| 5,574,309 A | 11/1996 | Papapietro et al. | 257/679 |
| 5,581,498 A | 12/1996 | Ludwig et al. | 365/63 |
| 5,582,858 A | 12/1996 | Adamopoulos et al. | 427/96 |
| 5,616,422 A | 4/1997 | Ballard et al. | 428/621 |
| 5,637,832 A | 6/1997 | Danner | 174/260 |
| 5,674,785 A | 10/1997 | Akram et al. | 437/217 |
| 5,719,749 A | 2/1998 | Stopperan | 361/769 |
| 5,739,581 A | 4/1998 | Chillara | 257/668 |
| 5,739,585 A | 4/1998 | Akram et al. | 257/698 |
| 5,739,588 A | 4/1998 | Ishida et al. | 257/782 |
| 5,742,479 A | 4/1998 | Asakura | 361/737 |
| 5,744,224 A | 4/1998 | Takeuchi et al. | 428/209 |
| 5,774,340 A | 6/1998 | Chang et al. | 361/771 |
| 5,784,259 A | 7/1998 | Asakura | 361/752 |
| 5,798,014 A | 8/1998 | Weber | 156/263 |
| 5,822,190 A | 10/1998 | Iwasaki | 361/737 |
| 5,826,330 A | 10/1998 | Isoda et al. | 29/852 |
| 5,835,355 A | 11/1998 | Dordi | 361/760 |
| 5,847,453 A | 12/1998 | Uematsu et al. | 257/728 |
| 5,872,399 A | 2/1999 | Lee | 257/738 |
| 5,894,108 A | 4/1999 | Mostafazadeh et al. | 174/52.4 |
| 5,903,052 A | 5/1999 | Chen et al. | 257/706 |
| 5,928,767 A | 7/1999 | Gebhardt et al. | 428/209 |
| 5,936,843 A | 8/1999 | Ohshima et al. | 361/760 |
| 5,952,611 A | 9/1999 | Eng et al. | 174/52.4 |
| 6,004,619 A | 12/1999 | Dippon et al. | 427/97 |
| 6,013,948 A | 1/2000 | Akram et al. | 257/698 |
| 6,021,564 A | 2/2000 | Hanson | 29/852 |
| 6,028,364 A | 2/2000 | Ogino et al. | 257/778 |
| 6,034,427 A | 3/2000 | Lan et al. | 257/698 |
| 6,040,622 A | 3/2000 | Wallace | 257/679 |
| 6,060,778 A | 5/2000 | Jeong et al. | 257/710 |
| 6,064,576 A | 5/2000 | Edwards et al. | 361/776 |
| 6,069,407 A | 5/2000 | Hamzehdoost | 257/774 |
| 6,072,243 A | 6/2000 | Nakanishi | 257/783 |
| 6,081,036 A | 6/2000 | Hirano et al. | 257/773 |
| 6,119,338 A | 9/2000 | Wang et al. | 29/852 |
| 6,122,171 A | 9/2000 | Akram et al. | 361/704 |
| 6,127,833 A | 10/2000 | Wu et al. | 324/755 |
| 6,160,705 A | 12/2000 | Stearns et al. | 361/704 |
| 6,172,419 B1 | 1/2001 | Kinsman | 257/737 |
| 6,175,087 B1 | 1/2001 | Keesler et al. | 174/261 |
| 6,184,463 B1 | 2/2001 | Panchou et al. | 174/52.4 |
| 6,204,453 B1 | 3/2001 | Fallon et al. | 174/255 |
| 6,214,641 B1 | 4/2001 | Akram | 438/107 |
| 6,235,554 B1 | 5/2001 | Akram et al. | 438/109 |
| 6,239,485 B1 | 5/2001 | Peters et al. | 257/700 |
| D445,096 S | 7/2001 | Wallace | D14/117 |
| D446,525 S | 8/2001 | Okamoto et al. | D14/436 |
| 6,274,821 B1 | 8/2001 | Echigo et al. | 174/255 |
| 6,280,641 B1 | 8/2001 | Gaku et al. | 216/17 |
| 6,316,285 B1 | 11/2001 | Jiang et al. | 438/106 |
| 6,351,031 B1 | 2/2002 | Iijima et al. | 257/698 |
| 6,353,999 B1 | 3/2002 | Cheng | 29/852 |
| 6,365,975 B1 | 4/2002 | DiStefano et al. | 257/777 |
| 6,376,906 B1 | 4/2002 | Asai et al. | 257/698 |
| 6,388,203 B1 | 5/2002 | Rinne et al. | 174/261 |
| 6,392,160 B1 | 5/2002 | Andry et al. | 174/261 |
| 6,395,578 B1 | 5/2002 | Shin et al. | 438/106 |
| 6,405,431 B1 | 6/2002 | Shin et al. | 29/852 |
| 6,406,942 B2 | 6/2002 | Honda | 438/119 |
| 6,407,341 B1 | 6/2002 | Anstrom et al. | 174/255 |
| 6,407,930 B1 | 6/2002 | Hsu | 361/784 |
| 6,451,509 B2 | 9/2002 | Keesler et al. | 430/311 |
| 6,479,762 B2 | 11/2002 | Kusaka | 174/261 |
| 6,497,943 B1 | 12/2002 | Jimarez et al. | 428/209 |
| 6,517,995 B1 | 2/2003 | Jacobson et al. | 430/320 |
| 6,534,391 B1 | 3/2003 | Huemoeller et al. | 438/612 |
| 6,544,638 B2 | 4/2003 | Fischer et al. | 428/322.7 |
| 6,548,393 B1 | 4/2003 | Lin | 438/618 |
| 6,586,682 B2 | 7/2003 | Strandberg | 174/255 |
| 6,608,757 B1 | 8/2003 | Bhatt et al. | 361/748 |
| 6,660,559 B1 | 12/2003 | Huemoeller et al. | 438/106 |
| 6,699,780 B1 | 3/2004 | Chiang et al. | 438/612 |
| 6,715,204 B1 | 4/2004 | Tsukada et al. | 29/847 |
| 6,727,645 B2 | 4/2004 | Tsujimura et al. | 313/504 |
| 6,730,857 B2 | 5/2004 | Konrad et al. | 174/257 |
| 6,753,612 B2 | 6/2004 | Adae-Amoakoh et al. | 257/774 |
| 6,787,443 B1 | 9/2004 | Boggs et al. | 438/612 |
| 6,800,506 B1 | 10/2004 | Lin et al. | 438/107 |
| 6,803,528 B1 | 10/2004 | Koyanagi | 174/262 |
| 6,815,709 B2 | 11/2004 | Clothier et al. | 257/40 |
| 6,815,739 B2 | 11/2004 | Huff et al. | 257/275 |
| 2002/0017712 A1 | 2/2002 | Bessho et al. | 257/700 |
| 2003/0128096 A1 | 7/2003 | Mazzochette | 338/22 |
| 2006/0183316 A1 | 8/2006 | Larnerd et al. | 438/622 |

FOREIGN PATENT DOCUMENTS

| | | |
|---|---|---|
| JP | 05-136323 | 6/1993 |
| JP | 07-017175 | 1/1995 |
| JP | 08-190615 | 7/1996 |
| JP | 10-334205 | 12/1998 |

OTHER PUBLICATIONS

Kuo, U.S. Appl. No. 11/615,467, filed Dec. 22, 2006, entitled "Blind Via Capture Pad Structure And Fabrication Method".

IBM Technical Disclosure Bulletin, "Microstructure Solder Mask by Means of a Laser", vol. 36, Issue 11, p. 589, Nov. 1, 1993.

Huemoeller et al., U.S. Appl. No. 11/839,277, filed Aug. 15, 2007, entitled "Straight Conductor Blind Via Capture Pad Structure And Fabrication Method".

SEMICONDUCTOR PACKAGE SUBSTRATE FABRICATION METHOD

CROSS-REFERENCE TO RELATED APPLICATIONS

This application is a divisional of U.S. patent application Ser. No. 10/701,782, filed on Nov. 5, 2003, entitled "INTEGRATED CIRCUIT SUBSTRATE HAVING EMBEDDED LANDS WITH ETCHING AND PLATING CONTROL SHAPES", which is a continuation-in-part of the following U.S. patent applications: 1) "IMPRINTED INTEGRATED CIRCUIT SUBSTRATE AND METHOD FOR IMPRINTING AN INTEGRATED CIRCUIT SUBSTRATE", U.S. patent application Ser. No. 09/884,193, filed Jun. 19, 2001, and issued as U.S. Pat. No. 6,967,124 on Nov. 22, 2005; 2) "INTEGRATED CIRCUIT SUBSTRATE HAVING LASER-EMBEDDED CONDUCTIVE PATTERNS AND METHOD THEREFOR", U.S. patent application Ser. No. 10/138,225, filed May 1, 2002, and issued as U.S. Pat. No. 6,930,256 on Aug. 16, 2005; 3) "SOLDERABLE INJECTION-MOLDED INTEGRATED CIRCUIT SUBSTRATE AND METHOD THEREFOR", U.S. patent application Ser. No. 09/931,144, filed Aug. 16, 2001, and issued as U.S. Pat. No. 6,784,376 on Aug. 31, 2004; and 4) "INTEGRATED CIRCUIT FILM SUBSTRATE HAVING EMBEDDED CONDUCTIVE PATTERNS AND VIAS", U.S. patent application Ser. No. 10/261,868, filed Oct. 1, 2002, now abandoned. Each of the above-listed parent applications has at least one common inventor and is assigned to the same assignee. The specifications of all of the above-listed parent applications are incorporated herein by reference.

FIELD OF THE INVENTION

The present invention relates generally to semiconductor packaging, and more specifically, to a substrate having embedded conductors and lands for providing an electrical interface between a die and external terminals in an integrated circuit package, wherein etching and plating control shapes are incorporated in the lands.

BACKGROUND OF THE INVENTION

Semiconductors and other electronic and opto-electronic assemblies are fabricated in groups on a wafer. Known as "dies", the individual devices are cut from the wafer and are then bonded to a carrier. The dies must be mechanically mounted and electrically connected to a circuit.

The above-incorporated parent applications describe a variety of means for producing substrates having conductors embedded beneath the surface of the substrate. The techniques disclosed therein provide increased conductor density and decreased inter-conductor spacing via embedded circuit technologies.

In particular, substrate and method embodiments described in the above-incorporated patent applications, a plating or paste screening process is used to provide conductive material within channels formed in a substrate. The metal is generally plated to completely fill the channels, which generally include channels forming lands for solder ball attach, passive-component attach and/or semiconductor die attach. The metal is then planarized to isolate the conductors by removing the conductive material that is above the substrate surface, forming a circuit pattern that is embedded beneath the surface of the substrate. An etching process that removes the conductive material above the surface of the substrate is one of the planarization process options disclosed in the above-incorporated parent applications.

However, when a plating process is used to deposit the conductive material in the channels and/or when an etching process is employed to planarize the conductive material, variations in width of conductors, and in particular the size of lands affects the plating and/or planarization process, as the rate of conductor deposit or removal is directly related to the size of a feature. With respect to interconnect lands, which are typically circular for a solder ball or flip-chip attach land and square or rectangular for a surface mount (SMT) component package attach land (such as lands for attaching SMT resistors, capacitors, diode and transistors), the relatively large size of the land leads to a "dimpling" effect, in which a higher etching current density around large features increases the rate of material removal. The result of the increased removal rate is a "dimple" in the centers of larger features, and in extreme cases, a loss of conductive material in the center of the feature. In the case of plating processes used to deposit the channel material, larger features lead to increased material build-up that is uneven and can result in the inability of the planarization process to remove the excess deposits.

Any of the above dimpling effects are undesirable, as the attachment region provided by the land becomes non-planar, which can affect solderball height for solderball attach lands, and planarity of SMT mounting lands. Variations in solderball height and planarity of SMT mounting lands can cause missed or weak interconnects to the substrate, resulting in failure of a circuit module.

Further, subsequent to the etching process, a further plating process is typically employed to provide improved solderability and/or protection of lands from environmental conditions such as oxidation by depositing gold or gold-nickel plating on the lands. The larger area of conductive features on the substrate such as the lands described above, increases the amount of plating material, which raises the cost of the plating procedure.

Therefore, it would be desirable to provide substrates having improved land planarity and a method of manufacturing the substrate, that reduce or eliminate the dimpling effect. It would further be desirable to provide a lower cost substrate and method of manufacturing the substrate that reduces plating costs.

SUMMARY OF THE INVENTION

The above objectives of reducing or eliminating dimpling and reducing plating cost are provided in a substrate and method for manufacturing a substrate. The substrate incorporates land feature shapes that reduce the contiguous conductive area of the land, thus reducing non-uniformity in the plating current density used to deposit conductive material during a plate-up process and the etching current density used to remove conductive material from above the substrate in a subsequent planarization process. The land shapes further decrease the amount of plating material required in subsequent plating operations that add precious metals for solderability and environmental protection.

The land shapes include sub-features such as interconnected lines or other interconnected geometric shapes that provide full land functionality, while reducing the area of the feature. The sub-features employed may be designed so that the line width of each sub-feature is the same as the line width of conductive patterns on the substrate, so that the etching process can be made completely or nearly completely uniform. A grid pattern may be employed, so that all of the sub-features intersect (providing electrical interconnection) while maintaining a uniform line width. Alternatively, in particular for circular features such as solderball lands, the features may be rings or ring segments interconnected by segments of conductor, or may be other geometric shapes interconnected by segments of conductor, so that a larger attach area is provided, while reducing plating/etching current density for the land, eliminating or reducing the dimpling effect. The above-described features may also be employed to reduce the cost of subsequent plating operations such as gold or gold-nickel plating, as less material must be deposited on the lands of the present invention than on typical solid lands, thus reducing the plating cost.

BRIEF DESCRIPTION OF THE DRAWINGS

The invention, as well as a preferred mode of use and advantages thereof, will best be understood by reference to the following detailed description of illustrative embodiments when read in conjunction with the accompanying drawings, wherein like reference numerals indicate like parts throughout.

DETAILED DESCRIPTION

Figure 1A:
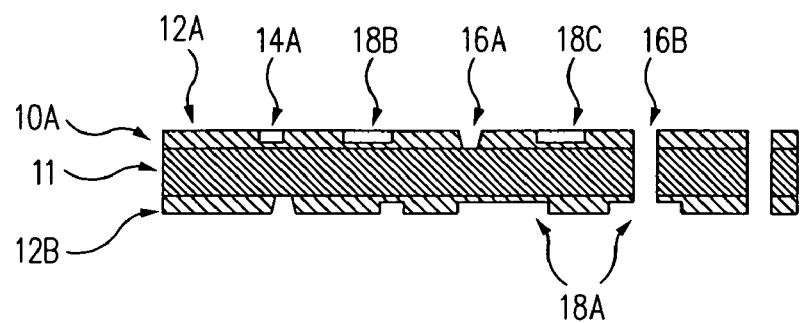
FIGS. 1A-1C are pictorial diagrams depicting a cross-sectional view of stages of preparation of an integrated circuit substrate in accordance with an embodiment of the present invention.
Figure 1B:
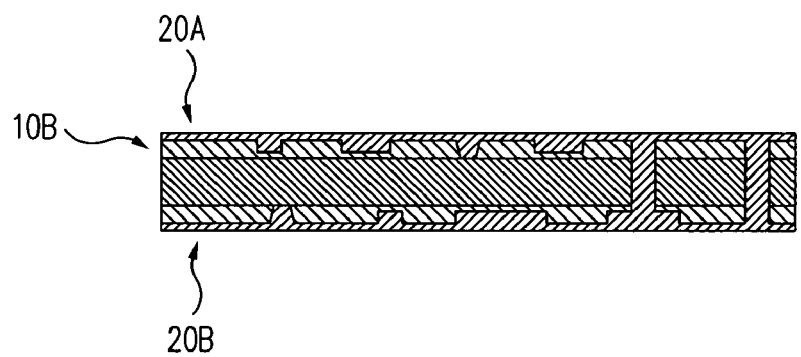
Figure 1C:
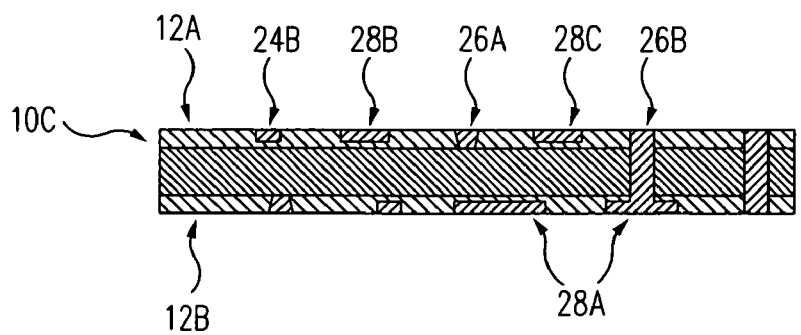

Referring now to the figures and in particular to FIGS. 1A-1C, a cross-sectional view of stages of preparation of a substrate in accordance with an embodiment of the present invention is shown. A first substrate stage 10A, having a dielectric top layer 12A, a dielectric bottom layer 12B and an optional core 11, which may be a metal ground plane layer or an insulating core, is prepared in accordance with techniques disclosed in the above-incorporated patent applications. Core 11 may be absent, in which case a single dielectric layer may be prepared on one or both sides in accordance with techniques disclosed in the above-incorporated patent applications.

Substrate stage 10A includes laser-cut or imprinted channels and other features including circuit pattern channels 14A, blind vias 16A, through vias 16B, and features for providing various lands 18A-18C. The present invention concerns the formation and shapes of land features 18A-18C so that dimpling is prevented or reduced during a plating process and/or a subsequent planarization etching process, while providing an attachment area adequate for attachment of passive components, solderballs, integrated circuit die terminals and wire bonds. Plating material requirements are also reduced during subsequent precious metals plating processes that provide solderable lands and/or environmental protection.

The above-incorporated patent applications describe laser-ablation and/or imprinting techniques for forming channels and other features in dielectric layers 12A and 12B and also describe the subsequent preparation stages of substrate 10A as depicted in FIGS. 1B-1C herein.

FIG. 1B depicts a substrate stage 10B in which metal layers 20A and 20B have been added to substrate stage 10A. The metal layers fill the conductive channels and other features so that conductive features may be provided for forming electrical connections between devices that are subsequently mounted on a finished substrate to form an integrated circuit. Metal layers 20A and 20B may be plated, paste-screened or applied using other techniques as described in the above-incorporated patent applications. If metal layers 20A and 20B are plated, the lands of the present invention prevent an uneven deposit of plated-up material.

After metal layers 20A and 20B have been applied, a etching process may be employed to remove the excess metal above the surfaces of dielectric layers 12A and 12B, so that a conductive pattern including lands in accordance with embodiments of the present invention are provided on a completed substrate 10C as depicted in FIG. 1C. After removal of the excess metal, further preparation processes may be applied to substrate 10C such as gold or nickel-gold plating of lands and application of solder masks. As the conductive channels within the substrates of the present invention may be produced by several combinations of techniques, it should be noticed that as long as one of the processes for depositing or planarizing the metal conductors involves etching or plating, the lands of the present invention will reduce or eliminate the dimpling effect and/or over-depositing of material. For example, the conductive material may be plated, but planarized using mechanical milling techniques, and the lands of the present invention will avoid the over-depositing of material in the larger land areas. Similarly, the conductive material may be paste-screened to deposit the conductive material and then etched to planarize the material, in which case the lands of the present invention will avoid over-etching the larger land areas. Finally, for substrates that are plated and then etched, the lands of the present invention avoid both plating and etching non-uniformity.

While the description above and FIGS. 1A-1C describe stages of one or more processes formerly disclosed in the above-incorporated patent applications, it should be noted that substrate 1C and the prior preparation stages include feature shapes that reduce or eliminate dimpling in lands formed in substrate 1C and also reduce the amount of plating material required to plate the lands if a gold or nickel-gold plating process is employed in the final stages of substrate 10C preparation. Land shapes in accordance with embodiments of the present invention will be described in detail below.

Figure 2A:
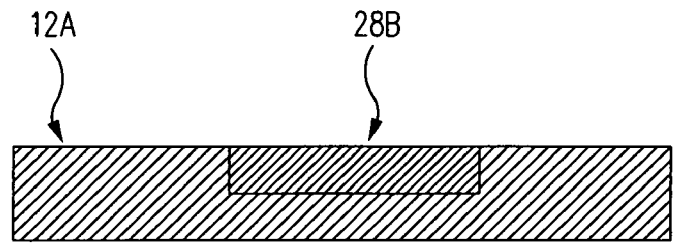
FIG. 2A is a pictorial diagram depicting the cross-section of a land in accordance with an embodiment of the present invention.
Figure 2B:
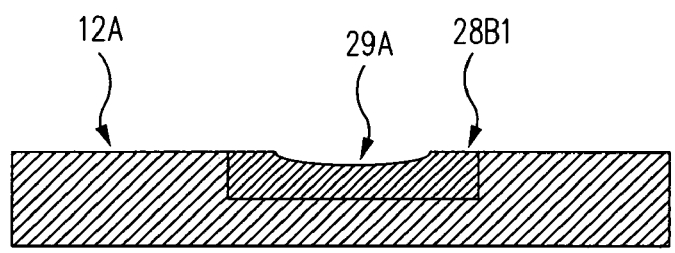
FIGS. 2B and 2C are pictorial diagrams depicting cross-sections of lands exhibiting dimpling.
Figure 2C:
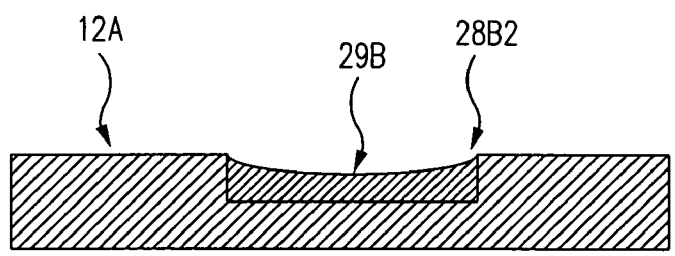

FIGS. 2A-2C depict cross-sections of lands that exhibit various degrees of "dimpling". FIG. 2A shows a desirable land in accordance with an embodiment of the present invention, that has a surface 28B that is substantially planar and exhibits no "dimpling". FIG. 2B shows a land with some dimpling effect, wherein surface 28B1 of the land has a concavity 29A produced by over-etching in the central area of the land. The over-etching is caused by increased current density in the electrochemical etching process. The increase is exhibited in the central regions of large conductive areas such as lands. Concavity 29A will not generally prevent contact between a component terminal and the conductive material forming the land, but a gap is provided that may weaken the mechanical strength of an attachment made to the land.

FIG. 2C depicts a land that is over-etched to form a concavity 29B that extends completely across the surface 28B2 of the land. Concavity 29B may cause a connection to be completely missed between a component terminal and the land. For example, in a flip-chip mounting configuration, if the land is a die terminal land, the terminal may not contact the land at all. If the land is a solderball land for providing external terminals in a ball grid array (BGA) package, a solderball may be attached to the land, but concavity 29B will cause a solderball height variation that will cause a failure in mounting the BGA package to an external mounting structure. Even moderate dimpling such as concavity 29A depicted in FIG. 2B will cause variation in solderball height due to the extra solder required to fill concavity 29A.

Figure 3A:
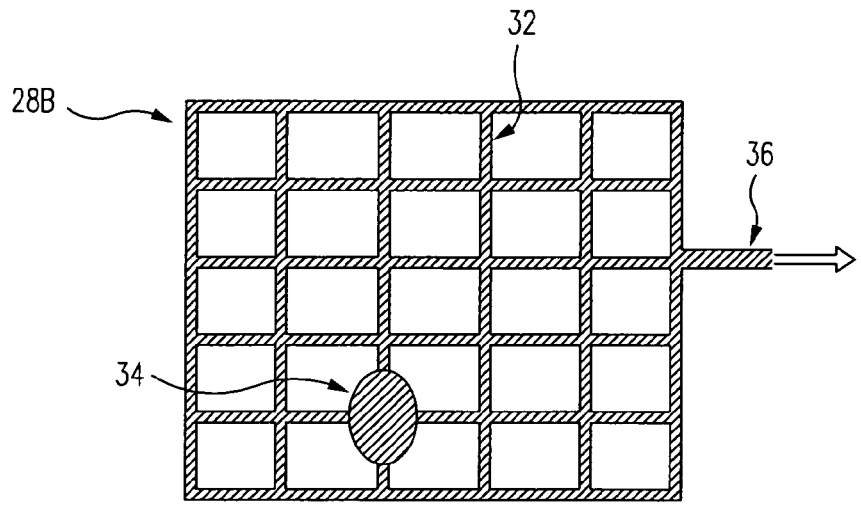
FIGS. 3A and 3B are pictorial diagrams depicting a top view and a cross-sectional view, respectively, of a land in accordance with an embodiment of the present invention.
Figure 3B:
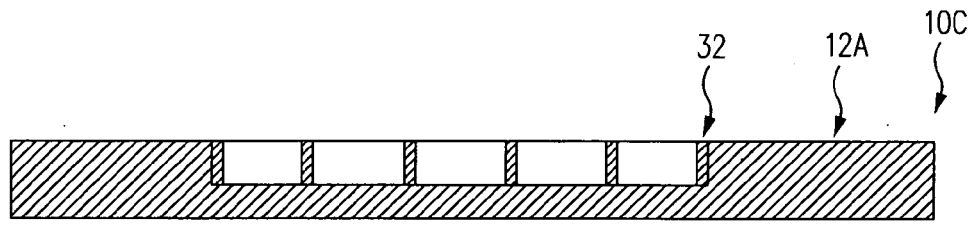

Referring now to FIG. 3A, a land 28B shaped in accordance with an embodiment of the present invention is depicted. Land 28B is a rectangular land provided for connection of surface mount (SMT) components and is formed in a grid pattern of channels forming conductive lines 32 when filled with conductor and the conductor is planarized. Due to the uniform width of lines 32, the etching current density is made uniform and generally the width of lines 32 will be chosen to match the width of other channels within the substrate. Connection to land 28B may be provided by a circuit pattern 36 line, by a via connection 34 which may be a blind or through via, or by both types of connection. FIG. 3B illustrates a cross-section showing the relationship of the grid lines 32 within dielectric layer 12A. The conductive lines 32 crossing from left to right in FIG. 3A are shown by the dashed lines, so that the location of conductive lines 32 depicted vertically in FIG. 3A can be shown within dielectric layer 12A. Land 28B provides sufficient contact area for solder attach of SMT components, while providing good planarity of the conductive line 32 surfaces forming land 28B, due to the elimination of the "dimpling" effect. Material applied to land 28B, such as gold or nickel-gold plating will be reduced according to the area reduction of the grid as opposed to a solid rectangular region, resulting in a lower final plating cost.

Figure 3C:
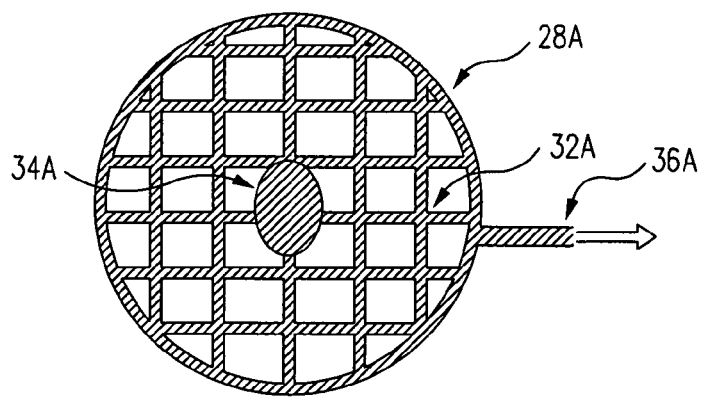
FIG. 3C is a top view of a land in accordance with another embodiment of the present invention.

FIG. 3C depicts a circular land 28A for solderball mounting, that is also formed in a grid pattern similar to that of rectangular land 28B. Interconnection can be provided by a via 34A, a conductive pattern 36A, or both as described above for land 28B, and land 28A provides similar elimination of dimpling and plating costs as for land 28B.

Figure 4A:
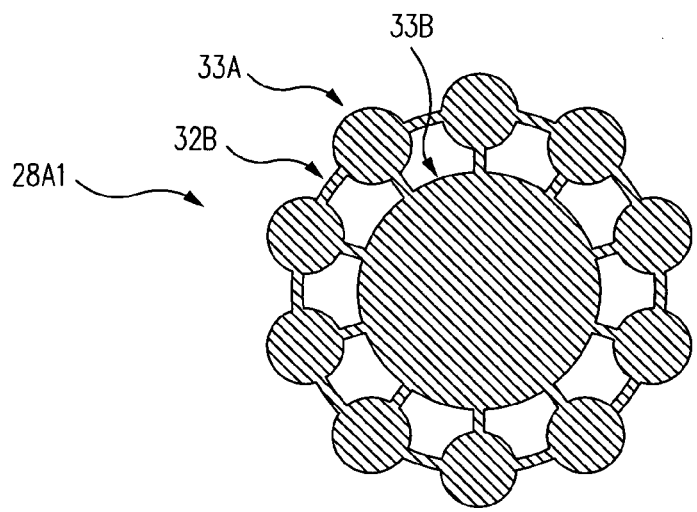
FIGS. 4A-4C are pictorial diagrams depicting a top view of lands in accordance with other embodiments of the present invention.
Figure 4B:
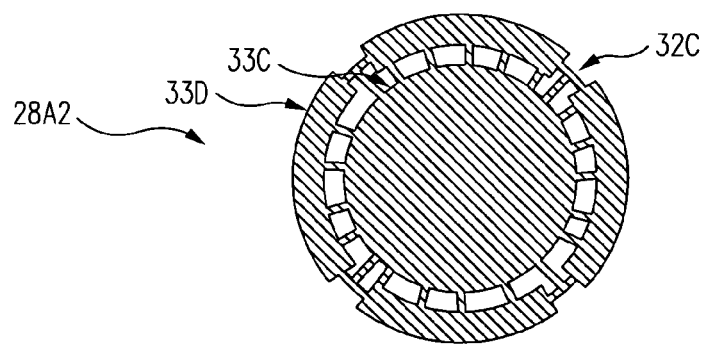
Figure 4C:
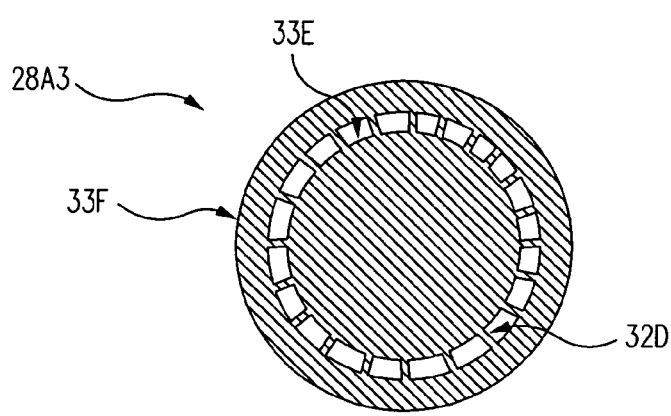

Referring now to FIGS. 4A-4C, alternative land designs for circular lands are depicted, such as lands suitable for solderball attach. Land 28A1 is a circular land formed from multiple circular regions 33A disposed radially about a larger central circular region 33B. The regions are connected by conductive channels 32B so that all of the regions are electrically connected. Land 28A1 provides a reduction in dimpling due to a current density reduction, while maintaining a larger central area than land 28B of FIG. 3A, which provides a greater mechanical attachment strength and may be preferable for external solderball terminal attachment points. Similarly, Land 28A2 is a circular land formed from multiple annular segments 33D disposed circumferentially at a common radius about a larger central circular region 33C. The regions are connected by conductive channels 32C so that all of the regions are electrically connected. Land 28A2 is an alternative to land 28A1 having similar properties of dimpling reduction while retaining a larger central area. Finally, FIG. 4C depicts another circular land 28A3 that includes a circular central area 33E and a single annulus 33F disposed around central area 33E and connected by conductive channels 32D.

Land 28A3 is another alternative to land 28A1 having similar properties of dimpling reduction while retaining a larger central area.

Figure 5A:
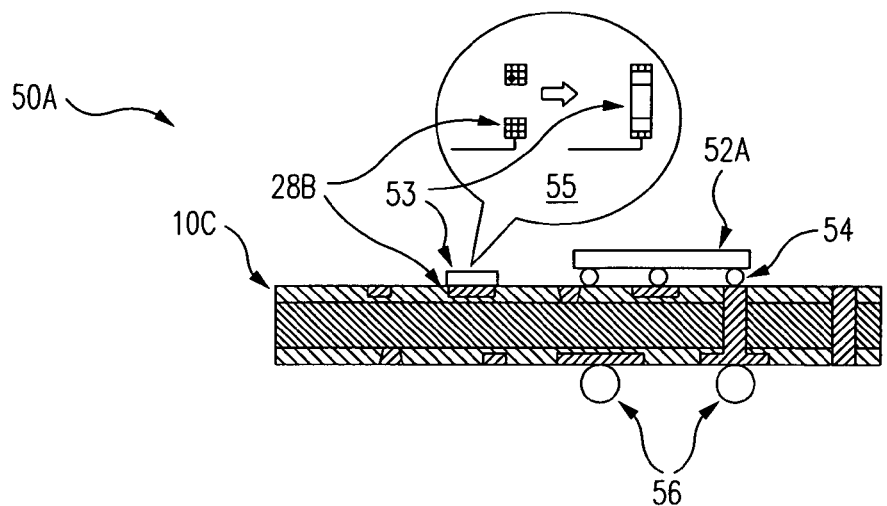
FIGS. 5A and 5B are pictorial diagrams depicting integrated circuits in accordance with embodiments of the present invention.

Referring now to FIG. 5A, an integrated circuit 50A, in accordance with an embodiment of the invention is shown. A die 52A is mounted on substrate 10C via a plurality of solder balls or posts 54 in a flip-chip configuration. A SMT component 53 is attached to lands 28B having a grid pattern as described above and as shown in a top view of the circuit area in balloon 55. External terminal solder balls 56 are added to the external terminal locations forming a complete integrated circuit package that may be subsequently encapsulated.

Figure 5B:
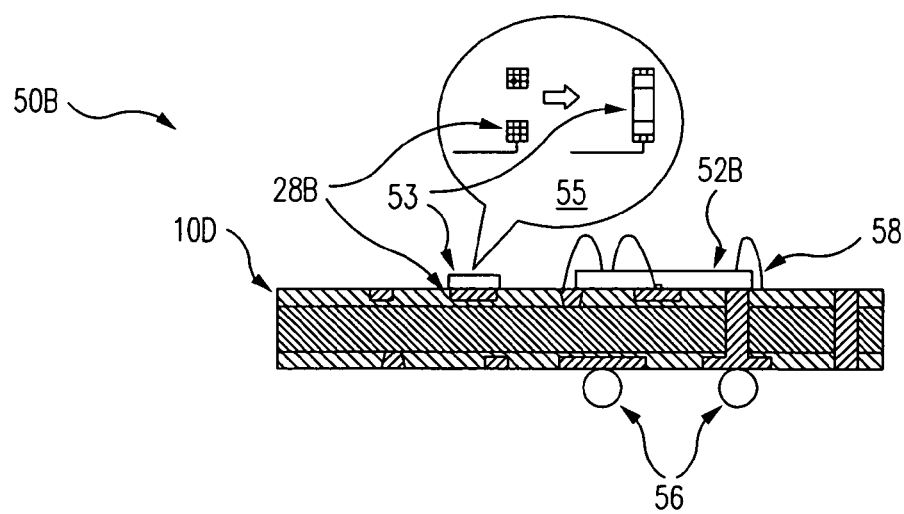

Referring now to FIG. 5B, another integrated circuit 50B is shown exemplifying a wire bonded configuration. Die 52B is mounted to substrate 10D with an adhesive (generally epoxy) and wires 58 are bonded between plated lands formed in substrate 10D. A SMT component 53 is attached to lands 28B having a grid pattern as described above and as shown in a top view of the circuit area in balloon 55. Solder balls 56 are added to the external terminal locations. Substrate 10D is manufactured according to the same steps as substrate 10C of FIG. 5A, but has different circuit patterns, lands and die mounting area for accommodating wire-attach type die 52B.

The above description of embodiments of the invention is intended to be illustrative and not limiting. Other embodiments of this invention will be obvious to those skilled in the art in view of the above disclosure and fall within the scope of the present invention.

What is claimed is:

1. A method of manufacturing a semiconductor package substrate, the method comprising:

forming channels within a dielectric layer defining a first surface of a substrate, the channels having sides extending to a plane defining the first surface of the substrate and having a bottom beneath the plane defining the first surface of the substrate, the channels further including at least one land area formed from multiple channels within the substrate, and wherein the at least one land area forms a shape having non-channel regions within a perimeter of the land area;

depositing conductive material filling the channels and extending over the first surface of the substrate; and etching the deposited conductive material, whereby conductive patterns are formed from the conductive material deposited in the channels and at least one land is formed from conductive material deposited in the at least one land area, whereby the conductive material in the at least one land area is not substantially dimpled by the etching due to a reduction of current density at the at least one land area.

2. The method of claim 1, wherein the forming is performed by laser ablating the dielectric layer.

3. A method of manufacturing an integrated circuit, the method comprising:

forming a substrate comprising a land in a land area of a dielectric layer of the substrate, the forming comprising:

forming channels within the land area, the channels having sides extending to a plane defining a first surface of the dielectric layer and having bottoms beneath the plane defining the first surface of the dielectric layer;

filling the channels with conductive material, the conductive material extending over the first surface of the dielectric layer; and etching the conductive material, wherein the conductive material remaining in the channels forms conductive lines, the conductive lines forming the land.

4. The method of claim 3 wherein the conductive lines form a grid pattern of intersecting orthogonal conductive lines.

5. The method of claim 3 wherein the conductive lines comprise a first plurality of parallel conductive lines and a second plurality of parallel conductive lines orthogonal to the first plurality of parallel conductive lines in a plane defined by the first surface of the dielectric layer, the first set of conductive lines intersecting the second set of conductive lines.

6. The method of claim 5 wherein the land is a rectangular land.

7. The method of claim 5 wherein the land is a circular land.

8. The method of claim 3 wherein the land area comprises non-channel regions and the conductive lines.

9. The method of claim 8 wherein the non-channel regions are between the conductive lines.

10. The method of claim 3 further comprising attaching a solderball to the land.

11. The method of claim 3 further comprising soldering a surface mount (SMT) component to the land.

12. The method of claim 3 wherein the channels are of uniform width such that an etching current density at said channels is uniform during the etching.

13. The method of claim 12 wherein the etching is performed without dimpling of the conductive lines.

14. The method of claim 3 wherein the filling the channels with conductive material comprises plating the conductive material within the channels, wherein the channels are of uniform width such that a plating current density at the channels is uniform during the plating.

15. The method of claim 14 wherein the plating is performed without any uneven deposit of the conductive material.

16. The method of claim 3 further comprising:
mounting a die to the substrate.

17. The method of claim 16 wherein the die is mounted in a flip-chip configuration to the substrate.

18. The method of claim 16 wherein the die is mounted in a wire bonded configuration to the substrate.

19. The method of claim 16 further comprising encapsulating the die.

20. A method of manufacturing a semiconductor package substrate, the method comprising:
forming a substrate comprising a land in a land area of a dielectric layer of the substrate, the forming comprising:
forming channels within the land area, the channels having sides extending to a plane defining a first surface of the dielectric layer and having bottoms beneath the plane defining the first surface of the dielectric layer;
filling the channels with conductive material, the conductive material extending over the first surface of the dielectric layer; and
etching the conductive material, wherein the conductive material remaining in the channels forms the land, the land comprising multiple regions electrically connected together, and the land area comprises non-channel regions between the multiple regions.

* * * * *